(12) United States Patent
Rivera Hernandez et al.

(10) Patent No.: US 8,472,194 B2
(45) Date of Patent: Jun. 25, 2013

(54) SOLID STATE SWITCHING DEVICE WITH INTEGRAL HEATSINK

(75) Inventors: Oscar Rivera Hernandez, Tijuana (MX); Oscar Montero Hernandez, Chula Vista, CA (US)

(73) Assignee: Custom Sensors & Technologies, Inc., Moorpark, CA (US)

( * ) Notice: Subject to any disclaimer, the term of this patent is extended or adjusted under 35 U.S.C. 154(b) by 0 days.

(21) Appl. No.: 12/774,178

(22) Filed: May 5, 2010

(65) Prior Publication Data

US 2011/0273844 A1    Nov. 10, 2011

(51) Int. Cl.
*H05K 7/20* (2006.01)

(52) U.S. Cl.
USPC ............ 361/710; 361/690; 361/702; 257/707

(58) Field of Classification Search
USPC .......... 361/676–678, 679.46, 679.49–679.51, 361/679.54, 688–697, 701–704, 709–710, 361/715–718, 752, 760–762
See application file for complete search history.

(56) References Cited

U.S. PATENT DOCUMENTS

| | | | |
|---|---|---|---|
| 3,536,960 A | 10/1970 | Otteson et al. | |
| 3,809,965 A | 5/1974 | Groth et al. | |
| 5,134,094 A | 7/1992 | Schovanec | |
| 5,212,627 A | 5/1993 | No | |
| 5,598,322 A | 1/1997 | Von Arx et al. | |
| 5,602,363 A | 2/1997 | Von Arx | |
| 7,079,395 B2 * | 7/2006 | Garnett et al. | 361/715 |
| 7,109,833 B1 | 9/2006 | Pohl | |
| 7,129,908 B2 * | 10/2006 | Edward et al. | 343/878 |
| 7,773,382 B2 * | 8/2010 | Kingston et al. | 361/719 |
| 7,859,837 B2 * | 12/2010 | Nemoz et al. | 361/690 |
| 7,898,810 B2 * | 3/2011 | Mason et al. | 361/717 |
| 2003/0063418 A1 | 4/2003 | Bergh et al. | |
| 2004/0087215 A1 | 5/2004 | Pohl et al. | |
| 2006/0126292 A1 * | 6/2006 | Pfahnl et al. | 361/695 |
| 2006/0133033 A1 * | 6/2006 | Straub et al. | 361/690 |
| 2006/0284308 A1 * | 12/2006 | Harada et al. | 257/729 |
| 2007/0238326 A1 * | 10/2007 | Fallah-Adl et al. | 439/67 |
| 2007/0252670 A1 * | 11/2007 | Darr | 337/143 |

OTHER PUBLICATIONS

Magnecraft Solutions Guide, Edition 105A, Section 4, Solid State Relays, 861 Series, pp. 4/1-4/11, www.magnecraft.com.

* cited by examiner

*Primary Examiner* — Courtney Smith
(74) *Attorney, Agent, or Firm* — Edward S. Wright

(57) ABSTRACT

Solid state switching device having a heatsink, a solid state switching element in heat conductive relationship with the heatsink, and an enclosure having ventilation openings adjacent to the heatsink through which air can flow to remove heat from the heatsink. In some disclosed embodiments, the heatsink has fins and ducts aligned with ventilation openings in the enclosure for removing heat by radiation and convection. In others, the heatsink is a generally planar baseplate, with ventilation openings in a side wall of the enclosure next to the baseplate for removing heat from the device. Spacers project laterally from the devices and permit a plurality of the devices to mounted side-by-side with space between the devices through which air can flow.

15 Claims, 8 Drawing Sheets

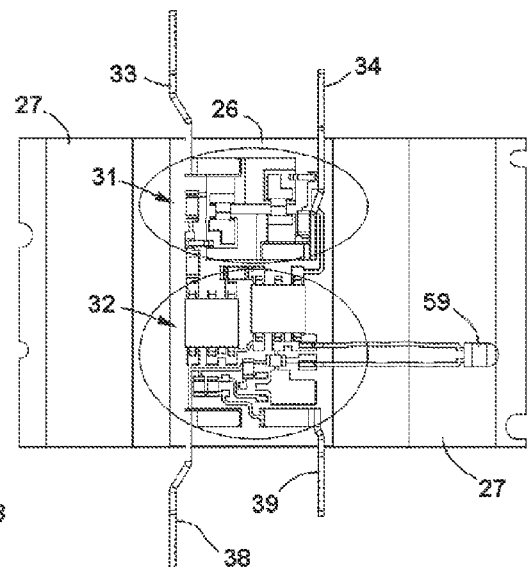
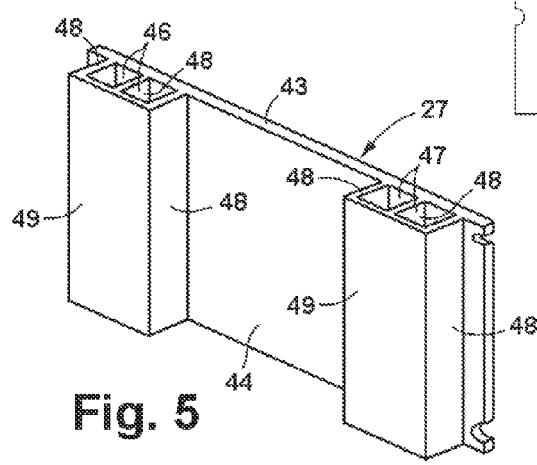
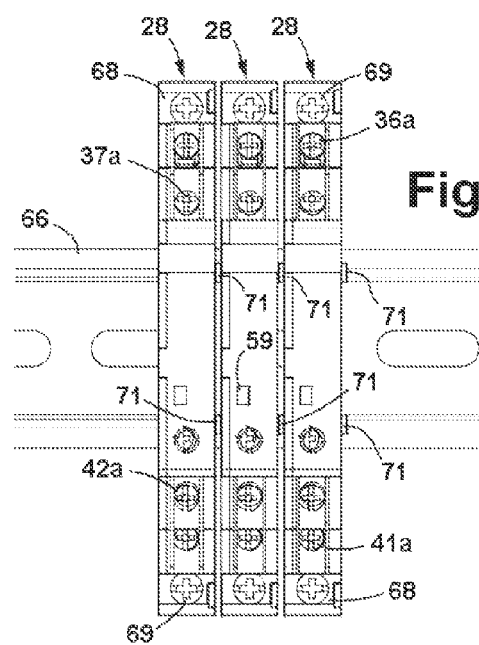
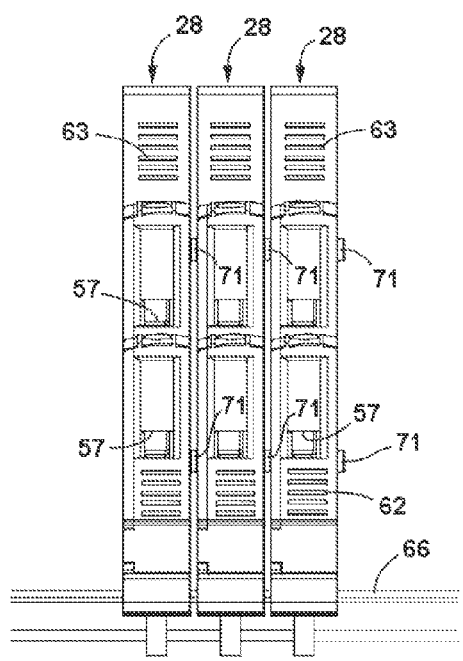

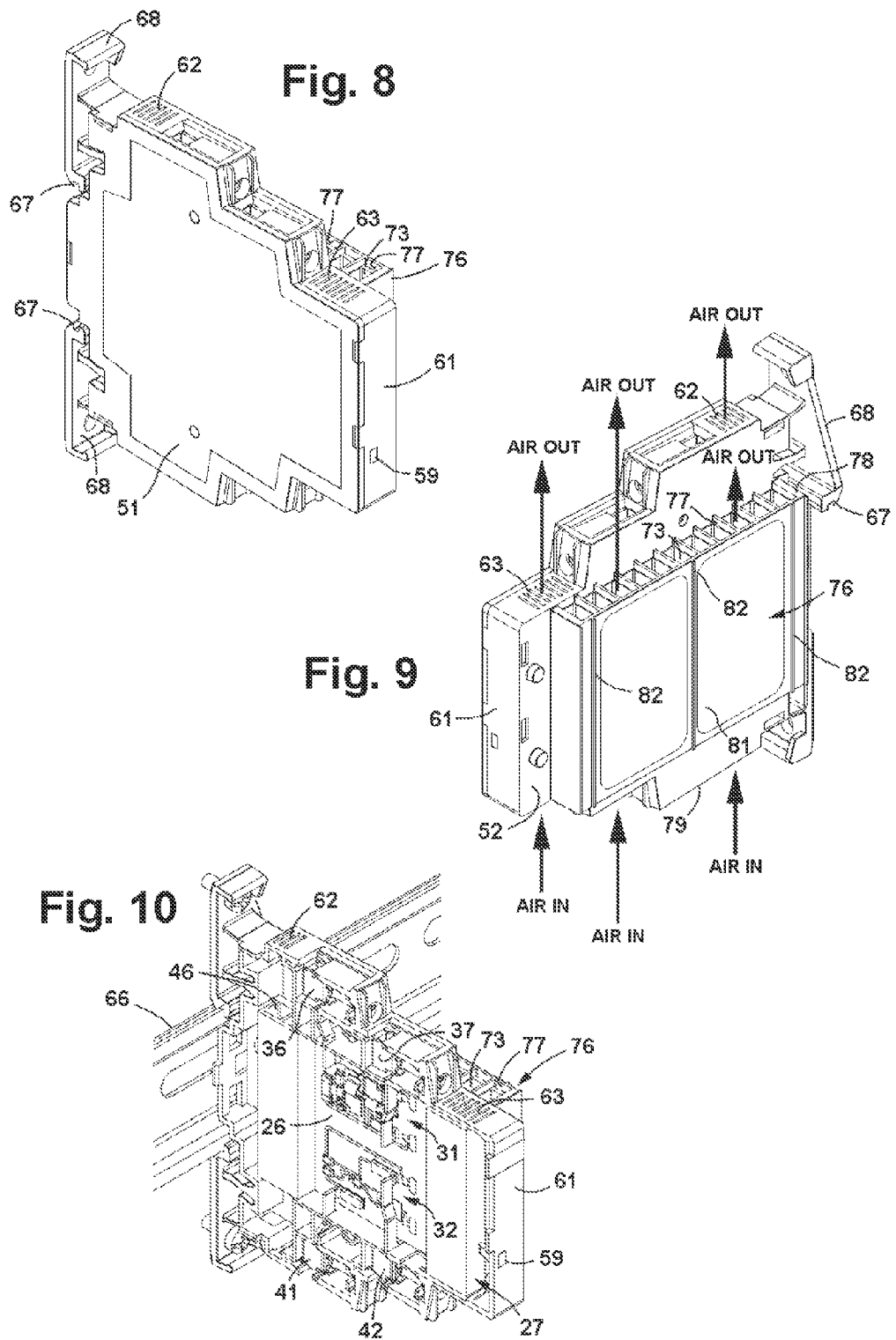

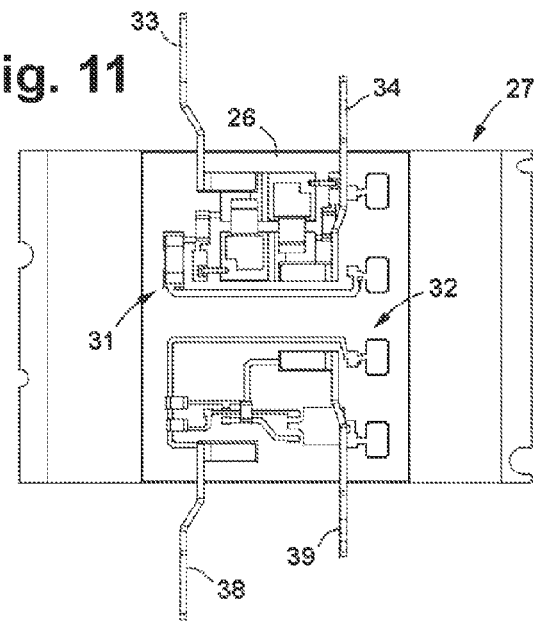
Fig. 11
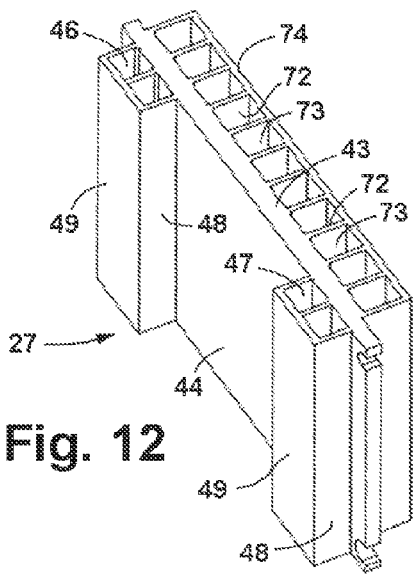
Fig. 12
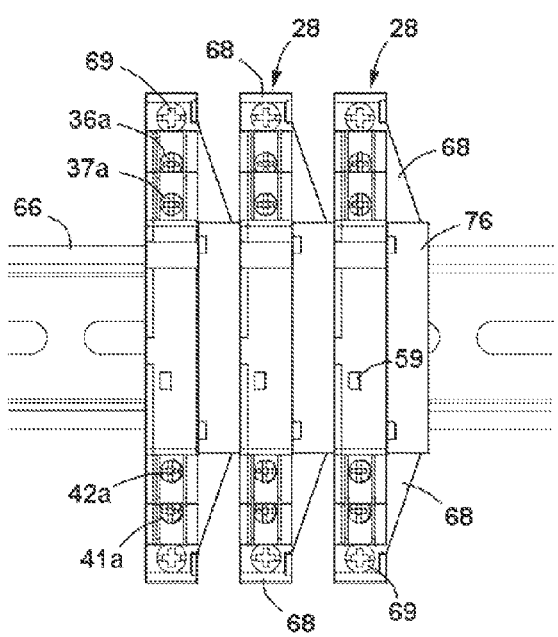
Fig. 13
Fig. 14

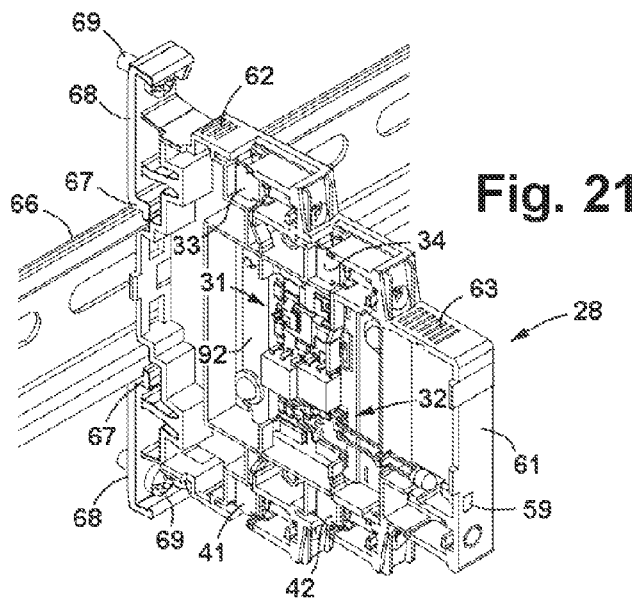
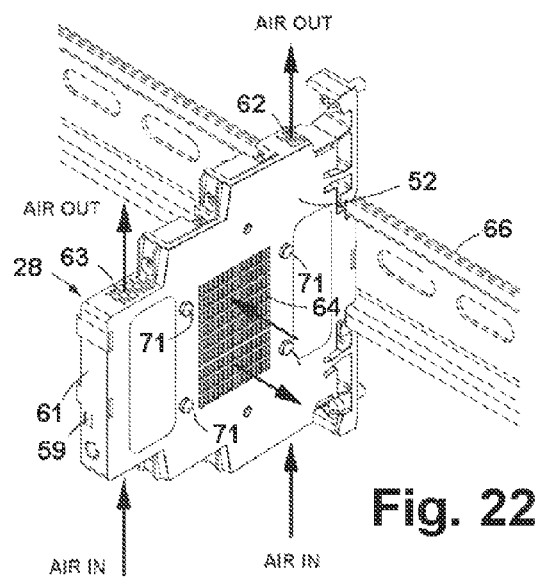
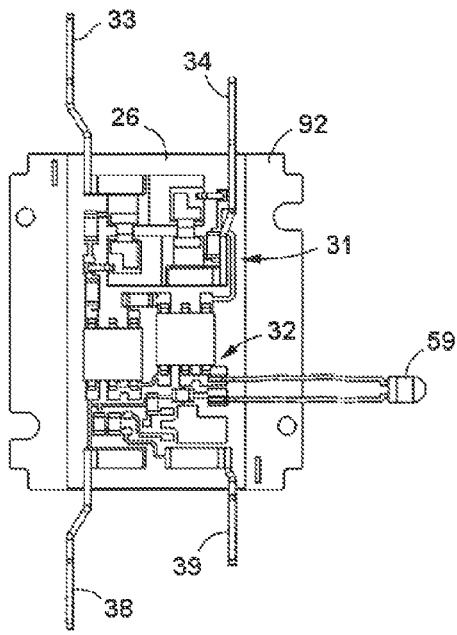

SOLID STATE SWITCHING DEVICE WITH INTEGRAL HEATSINK

BACKGROUND OF THE INVENTION

1. Field of Invention

This invention pertains generally to solid state switching devices and, more particularly, to a solid state switching device with an integral heatsink.

2. Related Art

Solid state switching devices such as solid state relays, power supplies and power modules produce heat which, if not properly dissipated or removed, limits the amount of power the devices can handle.

Heatsinks commonly employed in removing heat from solid state devices are typically made of metal and pose both thermal and electrical shock hazards to persons who may come into contact with them. Those hazards are sometimes avoided by enclosing the heatsinks in enclosures which are thermally and/or electrically non-conductive, but then the enclosures trap the heat and prevent it from being dissipated other than by conduction to and from the enclosures.

OBJECTS AND SUMMARY OF THE INVENTION

It is, in general, an object of the invention to provide a new and improved solid state switching device with improved heat dissipation.

Another object of the invention is to provide a switching device of the above character which overcomes the limitations and disadvantages of the prior art.

These and other objects are achieved in accordance with the invention by providing a solid state switching device having a heatsink, a solid state switching element in heat conductive relationship with the heatsink, and an enclosure having ventilation openings adjacent to the heatsink through which air can flow to remove heat from the heatsink. In some disclosed embodiments, the heatsink has fins and ducts aligned with ventilation openings in the enclosure for removing heat by radiation and convection. In others, the heatsink is a generally planar baseplate, with ventilation openings in a side wall of the enclosure next to the baseplate. Spacers project laterally from the devices and permit a plurality of the devices to mounted side-by-side with space between the devices through which air can flow.

BRIEF DESCRIPTION OF THE DRAWINGS

FIG. 4 is a plan view of the circuit board and associated components in the embodiment of FIG. 1.

FIG. 5 is an isometric view of the heatsink in the embodiment of FIG. 1.

FIG. 6 is a front elevational view of three of the switching devices in the embodiment of FIG. 1 mounted side-by-side on a DIN rail.

FIG. 7 is a top plan view of the three switching devices in the embodiment of FIG. 6.

FIG. 8 is a left front isometric view of another embodiment of a switching device according to the invention.

FIG. 9 is a right front isometric view of the embodiment of FIG. 8.

FIG. 10 is a view similar to FIG. 8 with the cover removed from the left side of the device.

FIG. 11 is a plan view of the circuit board and associated components on the heatsink in the embodiment of FIG. 8.

FIG. 12 is an isometric view of the heatsink in the embodiment of FIG. 8.

FIG. 13 is a front elevational view of three of the switching devices in the embodiment of FIG. 8 mounted side-by-side on a DIN rail.

FIG. 14 is a top plan view of the three switching devices in the embodiment of FIG. 13.

FIG. 21 is a left front isometric view of another embodiment of a switching device according to the invention, with the cover removed from the left side of the device.

FIG. 22 is a right front isometric view of the embodiment of FIG. 21.

FIG. 23 is a plan view of the circuit board and associated components in the embodiment of FIG. 21.

DETAILED DESCRIPTION

Figure 1:
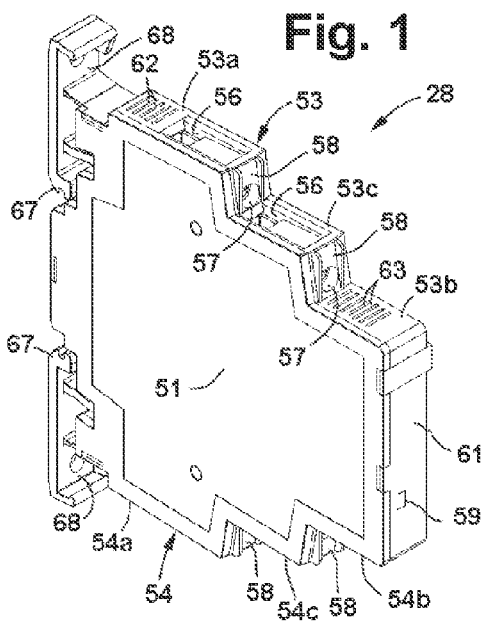
FIG. 1 is a left front isometric view of one embodiment of a switching device according to the invention.
Figure 2:
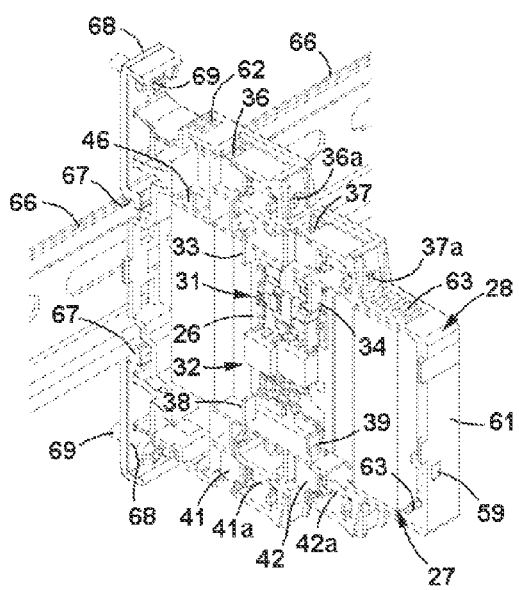
FIG. 2 is a view similar to FIG. 1 with the cover removed from the left side of the device.
Figure 3:
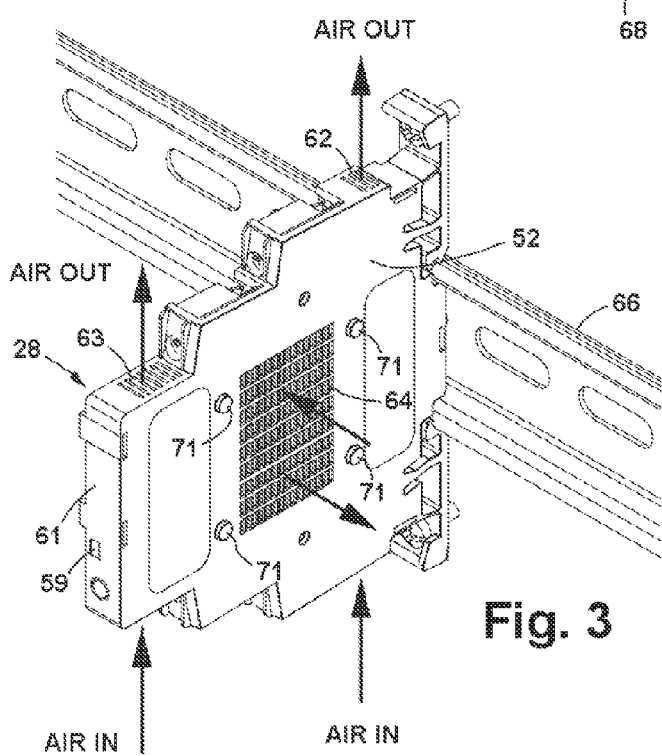
FIG. 3 is a right front isometric view of the embodiment of FIG. 1.

As illustrated in FIGS. 1-5, the switching device includes a circuit board 26 mounted on a heatsink 27 within an enclosure 28. In this particular embodiment, the device is a solid state relay with switching circuitry 31 and control circuitry 32 on the circuit board. Lead frames 33, 34 extend between switching circuitry 31 and box lug terminals 36, 37 which are accessible externally of the enclosure for connection to the circuit to be controlled, and lead frames 38, 39 extend between control circuitry 32 and box lug terminals 41, 42 which are likewise accessible externally of the enclosure for connection to an external control circuit. The lead frames are a rigid structure, and the box lug terminals are mounted on and supported by the lead frames as well as being connected to them electrically. Alternatively, if desired, the lead frames can be flexible, e.g. flexible braids or wires, with the terminals being mounted on and supported by the enclosure. Similarly, terminal blocks can be utilized rather than the terminal lugs, if desired.

Circuit board 26 is a flat, generally rectangular board fabricated of ceramic or other electrically insulative material. The components associated with the switching circuitry and the control circuitry are mounted on one side of the board, with connections between the components being made by surface conductors bonded to that side of the board. The back side of the board is free from protrusions or irregularities that would prevent it from making good thermal contact with the heatsink throughout its entire surface area. If desired, a layer of copper can be added on the backside of the board to further improve thermal contact. Another way in which the switching and/or control circuitry can be mounted is by applying and curing a layer of isolation material, such as resin, over the heatsink, then adding conductive circuit traces to the isolation material by printing thin layers of copper to interconnect the components.

Heatsink 27 has a generally planar base 43 with a central mounting area 44 and two groups of cooling ducts 46, 47 on opposite sides of the mounting area on one side of the base. The ducts are formed between fins 48 which extend between the base and outer walls 49, 49 that are spaced from and generally parallel to the base. The base, fins, and outer walls are formed as a unitary structure by a process such as extrusion, casting, or machining and of a thermally conductive material such as aluminum, copper, brass, or even a molded polymer resin of high thermal conductivity. The ducts are open at the ends so that air can pass through them and carry heat away from the heatsink and the components on the circuit board in the mounting area between the two groups of ducts.

Enclosure 28 is a relatively thin, flat housing fabricated of an electrically insulative material such as a durable rigid plastic. It includes a pair of generally parallel side walls 51, 52 between which the circuit board and heatsink are mounted, with the circuit board and the base of the heatsink parallel to the walls. The upper and lower walls 53, 54 of the enclosure are stepped, with outer steps 53a, 54a toward the front of the enclosure, inner steps 53b, 54b toward the rear, and middle steps 53c, 54c between the others.

Box lug terminals 36, 37 are located just below steps 53a and 53c of top wall 53, with openings 56 in the steps through which the power circuit wires can pass and openings 57 in the risers 58 between the steps providing access to terminal screws 36a, 37a. Similarly, box lug terminals 41, 42 are located just above steps 54a, 54c of lower wall 54, with openings 56 in the steps for the control circuit wires and openings 57 in the risers 58—above the steps for access to terminal screws 41a, 42a.

A status indicator comprising a light emitting diode (LED) 59 is connected to the control circuitry 32 within the housing and extends through an opening in the rear wall 61 of the enclosure to provide a visual indication as to whether the switching circuit is open or closed.

Vent openings 62, 63 are provided in the outer and inner steps of the upper and lower walls of the enclosure in axial alignment with the cooling ducts 46, 47 of heatsink 27. In addition, a ventilating grill 64 is formed in side wall 52 of the enclosure adjacent to the back side of the mounting area of the heatsink.

In this embodiment, the switching device is illustrated as being mounted in a vertical position on a horizontally extending DIN rail 66, with jaws 67 on the front side of the enclosure securing the device to the rail. The front of the enclosure also includes mounting tabs 68 which receive mounting screws 69 and permit the device to be mounted on a panel (not shown) instead of a DIN rail, if desired.

Spacers 71 project laterally from the outer surface of side wall 52 for engagement with the side wall 51 of another similar switching device when a plurality of such devices are mounted side by side on a DIN rail, as illustrated in FIGS. 6 and 7. The spacers maintain separation between the walls of adjacent devices so that air can flow freely between the devices and through the grills in the side walls as well as through the heatsink ducts and the openings in the upper and lower walls of the enclosure, thus avoiding direct contact between side walls of adjacent devices and minimizing co-heating between the devices during operation. In this particular embodiment, the spacers are illustrated as being in the form of short, circular cylinders, but they can be of any size and shape desired, and they can be positioned wherever desired, for example to host rivets (not shown) that hold wall 52 to heatsink 27.

The embodiment shown in FIGS. 8-13 is generally similar to the embodiment of FIGS. 1-5, and like reference numerals designate corresponding elements in the two.

In the embodiment of FIGS. 8-13, however, additional cooling fins 72 and ducts 73 are provided on the back side of heatsink 27. These fins extend between base 43 and an outer wall 74 that is spaced from and generally parallel to the base, with the ducts being formed between the fins. The ducts are open at the ends and are generally coextensive with the back side of the base.

The ducts on the back side of the heatsink extend into a compartment 76 which projects laterally from side wall 52 of enclosure 28. Vent openings 77 are formed in the upper and lower walls 78, 79 of the compartment in alignment with the ducts.

The outer surface of the side wall 81 of compartment 76 is generally planar, with vertically extending spacers 82 projecting laterally from it for engagement with the side wall 51 of another similar switching device when a plurality of such devices are mounted side by side on a DIN rail, as illustrated in FIGS. 13 and 14. The spacers maintain separation between the walls of adjacent devices so that air can flow freely between them, thereby avoiding direct contact between side walls of adjacent devices and minimizing co-heating between the devices during operation.

Figure 15:
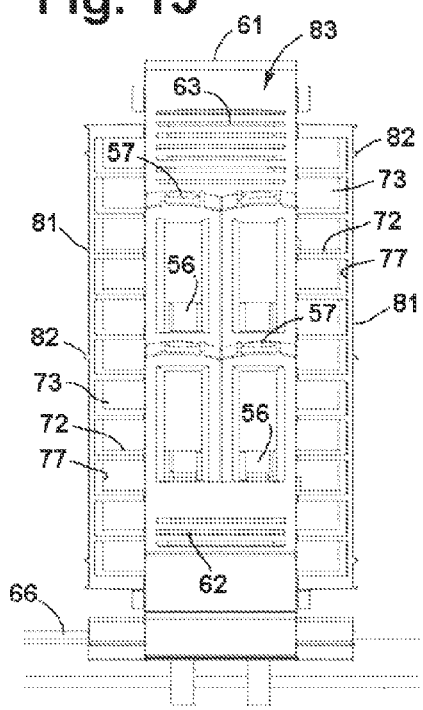
FIGS. 15-17 are top plan views of additional embodiments of switching devices according to the invention.
Figure 16:
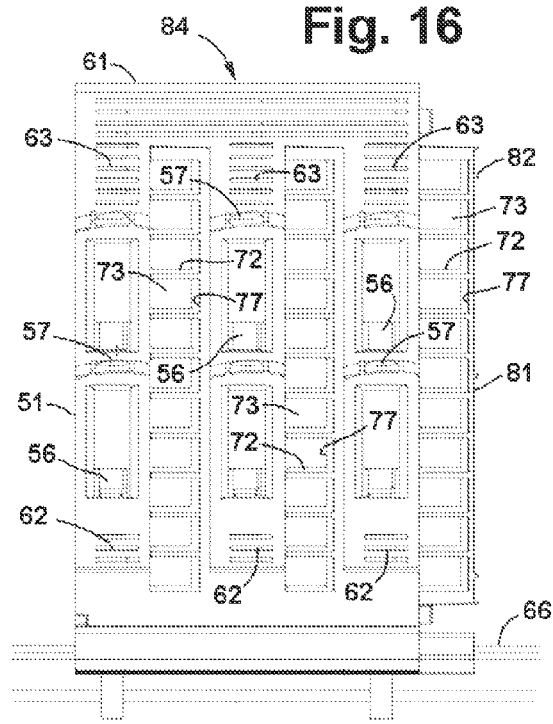
Figure 17:
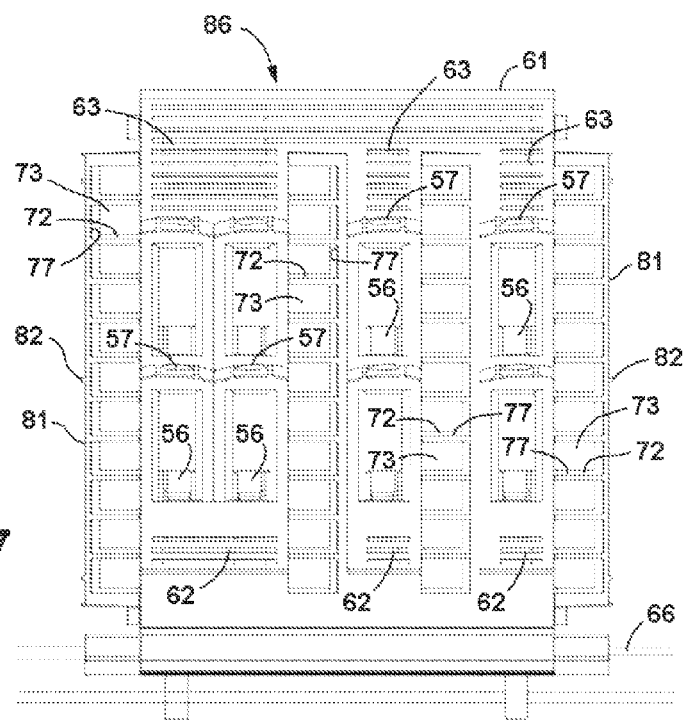

Rather than having multiple units mounted side by side in separate housings, the units can be combined in a single enclosure, as illustrated in FIGS. 15-17. In these embodiments, each unit or module has a circuit board and associated components of the type shown in FIG. 11 mounted on a heatsink of the type shown in FIG. 12.

In the embodiment of FIG. 15, two units or modules are mounted facing each other in a single enclosure 83 which is generally similar to two enclosures of the type shown in FIGS. 8 and 9 placed face to face, with no wall between them, and vent openings 77 aligned with ducts 73 on the back sides of the heatsinks and vent openings 62, 63 aligned with ducts 46, 47 on the front sides of the heatsinks in the two modules.

In the embodiment of FIG. 16, three units or modules are mounted facing the same direction in a single enclosure 84 which is generally similar to three enclosures of the type shown in FIGS. 8 and 9 stacked front-to-back, with no walls between them, and vent openings 77 aligned with ducts 73 on the back sides of the heatsinks and vent openings 62, 63 aligned with ducts 46, 47 on the front sides of the heatsinks in all three of the modules.

In the embodiment of FIG. 17, four units or modules are mounted in a single enclosure 86. In this embodiment, three of the units face one direction, as in the embodiment of FIG. 16, and the fourth unit faces in the opposite direction and is positioned face-to-face with one of the other three. The enclosure is similar to enclosure 84, with the addition of a fourth section to accommodate the fourth module. Once again, vent openings 77 are aligned with ducts 73 on the back sides of the heatsinks and vent openings 62, 63 are aligned with ducts 46, 47 on the front sides of the heatsinks in all of the modules.

Figure 18:
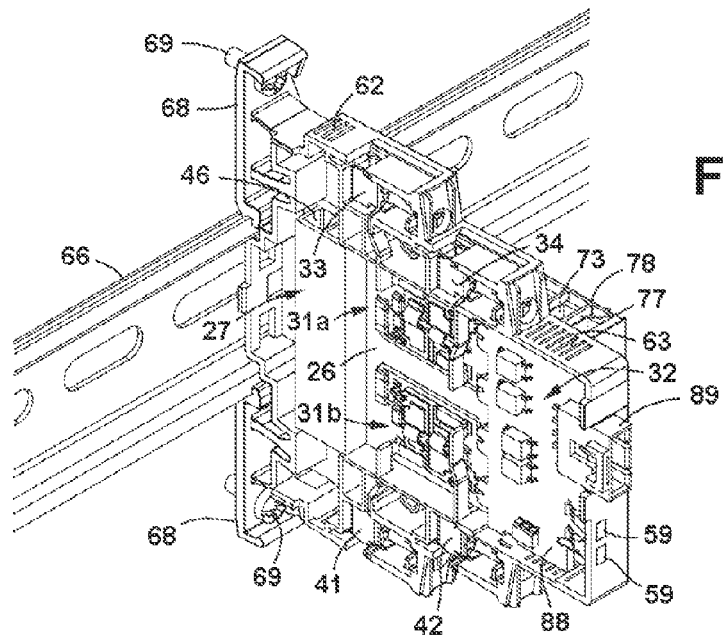
FIG. 18 is left front isometric view of another embodiment of a switching device according to the invention, with the cover removed from the left side of the device.
Figure 19:
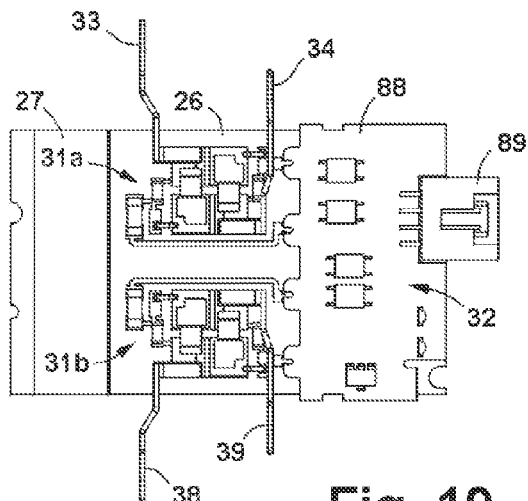
FIG. 19 is a plan view of the circuit boards and associated components on the heatsink in the embodiment of FIG. 18.
Figure 20:
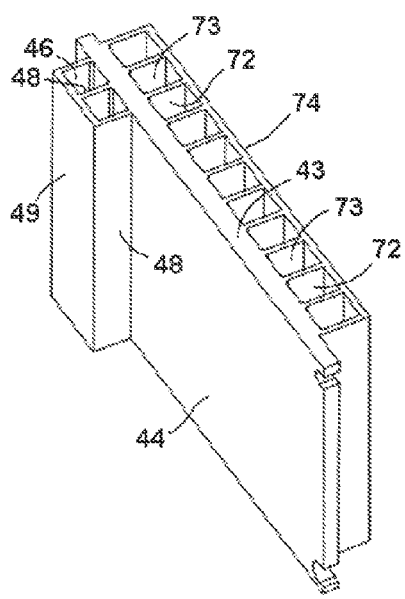
FIG. 20 is an isometric view of the heatsink in the embodiment of FIG. 18.

FIGS. 18-20 illustrate a solid state relay having two independent power switching channels. This embodiment differs from the embodiment of FIGS. 8-12 in that the switching circuitry 31a, 31b for the two channels is mounted on circuit board 26 in a central position on the front side of heatsink 27 and the control circuitry 32 is mounted on a separate circuit board 88 positioned to one side of the switching circuitry. To accommodate this arrangement, cooling fins 48 and ducts 46 are provided only on one side of mounting area 44, and the mounting area is extended to receive the second circuit board.

In this embodiment, terminals 36, 37 are connected to the switching circuitry 31a for one of the channels, and terminals 41, 42 are connected to the switching circuitry 31b for the other. A separate connector 89 for the control circuitry is mounted on circuit board 88 and extends through the rear wall 61 of the enclosure for connection to an external control circuit. Separate LEDs 59 indicate the status of the two switching channels.

The arrangement of circuit boards 26, 88 permits many other alternatives such as two, three or four independent switching channels, one switching channel plus control circuitry for a solid state relay, and one channel with control circuitry capable of performing a variety of functions such as timers, phase control, and integral cycle control. In addition, connector 89 allows for external feedback signals to be entered and processed in the control circuitry on circuit board 88 along with other control signals.

The embodiment shown in FIGS. 21-23 is generally similar to the embodiment of FIGS. 1-5, but with the heatsink in the form of a generally planar, thermally conductive baseplate 92. Circuit board 26 is mounted on the front side of the baseplate, with the back side of the board in direct thermal contact with the front side of the plate and the back side of the plate in close proximity to grill openings 64 in the side wall 52 of the enclosure.

In this embodiment, heat from switching circuitry 31 and control circuitry 32 is removed by conduction to the baseplate and by radiation and convection as air circulates past the circuit board and baseplate through vent openings 62, 63 and grill openings 64.

Figure 24:
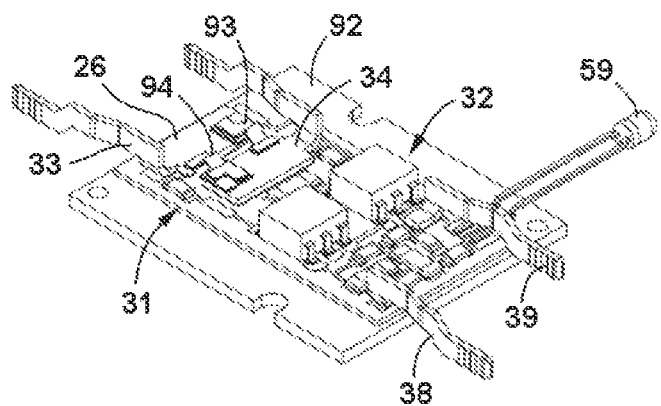
FIG. 24 is a plan view of another embodiment of a circuit board and associated components for use in the invention.

FIG. 24 illustrates an embodiment in which rigid lead frames 33, 34 are bonded to the circuit board 26 and serve as a platform for solid state switching elements 93, 94 which are mounted directly to the lead frames. If desired, the switching elements in the other embodiments can be mounted in a similar manner, rather than being mounted beside the lead frames on the circuit board.

Figure 25:
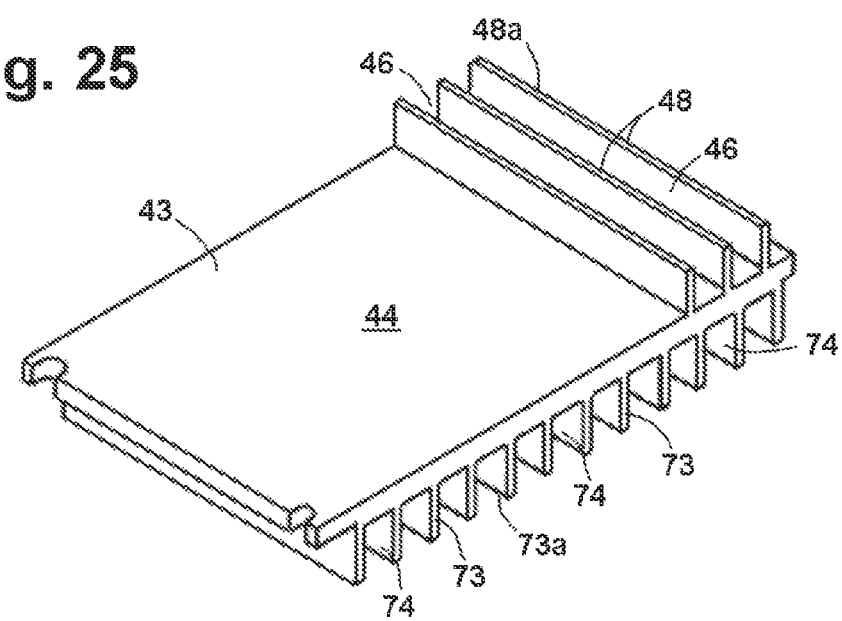
FIG. 25 is an isometric view of another embodiment of a heatsink which can be utilized in the invention.

The heatsink illustrated in FIG. 25 is similar to the one shown in FIG. 20 in that cooling fins 48 and ducts 46 are provided only on one side of mounting area 44 on the front side of base 43, and cooling fins 72 and ducts 73 are provided on the back side the heatsink. However, it differs in that the heatsink itself has no outer walls to close off the outer sides of the ducts. Instead, the outer edges of the fins 48, 72 abut against the inner surfaces of side walls 51, 52 to close off the outer sides of the ducts. As in the other embodiments the ends of the ducts are open, and the ducts are aligned with vent openings 63, 77 in the enclosure, with heat being removed by conduction to the baseplate and by radiation and convection as air circulates past the circuit board and baseplate through vent openings 63, 77.

The invention has a number of important features and advantages. It provides both thermal and electrical isolation for the heatsink and other components within the enclosure while allowing air to circulate freely through the heatsink fins and ducts. Thus, in contrast to prior art devices where heatsinks are totally enclosed and the heat removal is limited to conduction to the enclosure, heat produced internally by a heat source such as a power switching device is first removed by conduction through the heatsink and is then dissipated to the air by radiation and convection by virtue of the ducts and the exposed surfaces of the walls of the ducts.

In solid state switching applications such as solid state relays, power supplies, and power modules, the invention provides a significant increase in the amount of power that can be dissipated and correspondingly higher load current ratings and/or higher operating ambient temperatures compared to traditional solid state switching devices with totally enclosed heatsinks. When forced air is applied to the solid state switching devices, the increases in power dissipation and output current are even more dramatically increased, thereby providing a very high power density.

The invention effectively minimizes the problem of co-heating between switching devices such as solid state relays, power supplies or contactors operating side-by-side, with the spacers on the side walls holding the devices apart, preventing heat radiated from one device from being conducted or radiated to another, and allowing air to flow between the devices, thereby creating an air barrier that limits co-heating and removes hot air through free air flow.

With the heatsink mounted parallel to the side walls of the enclosure, the device is substantially narrower than devices having heatsinks on the back side of the heat source. This reduction in width, combined with the airflow through and between devices operating side-by-side provides a with very high power density (number of devices operating simultaneously in a given space) compared to prior devices having enclosed heatsinks and heatsinks on the back side of the heat source.

With both DIN rail and panel mounts as integral parts of the housing, the device can be mounted either on a DIN rail or on a panel without additional mounting bracket or parts. Moreover, the device is significantly lighter in weight than devices in which a potting material is utilized, although potting materials can still be used if desired.

It is apparent from the foregoing that a new and improved switching device has been provided. While only certain presently preferred embodiments have been described in detail, as will be apparent to those familiar with the art, certain changes and modifications can be made without departing from the scope of the invention as defined by the following claims.

The invention claimed is:

1. A solid state switching device comprising a heatsink having a generally planar base, first and second groups of heat conductive fins extending in opposite directions from opposite sides of the base with open ended ducts between the fins on both sides of the base, a solid state switching element in heat conductive relationship with the base beside the second group of fins, and an enclosure having ventilation openings in axial alignment with the open ended ducts through which air can flow to remove heat from the heatsink by radiation and convection.

2. The switching device of claim 1 including a third group of fins and ducts on the side of the base with the second group.

3. The switching device of claim 1 including control circuitry on the side of the base with the second group of fins.

4. A solid state switching device comprising a heatsink having a generally planar base and two groups of heat conductive fins with open ended ducts between the fins on one side of the base, a switching element positioned between the two groups of fins on the one side of the base, and an enclosure having ventilation openings in registration with the ducts through which air can flow to remove heat from the heatsink by radiation and convection and a ventilation grill on the side of the base opposite the switching element through which air can flow to carry additional heat away from the heatsink.

5. A solid state switching device, comprising a heatsink having a plurality of heat conductive fins with open ended ducts between the fins, a solid state switching element in heat conductive relationship with the heatsink, an enclosure having ventilation openings in registration with the ducts and first and second generally planar side walls which permit a plurality of the solid state switching devices to be mounted side-by-side with the first side wall of one device facing the second side wall of another, additional ventilation openings in one of the side walls, and spacers projecting laterally from one of the side walls to maintain space for air flow between the side walls of adjacent ones of the devices.

6. A solid state switching device, comprising an enclosure having a pair of laterally spaced side walls of substantially greater dimension than the spacing between them, upper and lower walls with vertically aligned vent openings, mounting means toward the rear of the enclosure for mounting the enclosure in an upright position with the side walls extending vertically, a heatsink within the enclosure having a generally planar base extending in a direction parallel to the side walls of the enclosure, with a generally planar mounting surface and a plurality of air ducts aligned axially with the vent openings in the upper and lower walls on opposite sides of the base, a solid state switching element mounted on a circuit board having a generally planar surface opposite the switching element in thermally conductive contact with the mounting surface of the heatsink, terminals accessible outside the enclosure for connection to an electrical circuit controlled by the switching element, and leads interconnecting the switching element and the terminals.

7. The switching device of claim 6 wherein the terminals are lugs that are mounted on and supported by the leads.

8. The switching device of claim 6 wherein the terminals are terminal blocks.

9. The switching device of claim 6 wherein the leads are mounted directly to the circuit board and are an integral part of electrical circuitry mounted on the board.

10. A solid state switching device, comprising an enclosure having a pair of laterally spaced side walls of substantially greater dimension than the spacing between them, upper and lower walls with vertically aligned vent openings, mounting means for mounting the enclosure in an upright position with the side walls extending vertically, a heatsink within the enclosure having a generally planar mounting surface and a plurality of air ducts aligned axially with the vent openings in the upper and lower walls, a circuit board having a generally planar surface on one side thereof in thermally conductive contact with the mounting surface of the heatsink, a solid state switching element on a second side of the circuit board, terminals accessible outside the enclosure for connection to an electrical circuit controlled by the switching element, and leads interconnecting the switching element and the terminals, with the switching element mounted directly on the leads and the leads in thermally conductive contact with the circuit board.

11. A solid state switching device comprising an enclosure having a pair of laterally spaced side walls of substantially greater dimension than the spacing between the walls, upper and lower walls with aligned vent openings, a compartment offset outwardly from one of the side walls, with aligned vent openings in upper and lower walls of the compartment, mounting means toward the rear of the enclosure for mounting the enclosure in an upright position; a heatsink having a generally planar base which is positioned between and generally parallel to the side walls of the enclosure, a first group of air ducts on a first side of the base aligned with the vent openings in the upper and lower walls of the enclosure, and a second group of air ducts on a second side of the base in alignment with the vent openings in the upper and lower walls of the compartment; a solid state switching element mounted on a circuit board in thermally conductive contact with the first side of the base of the heatsink; terminals accessible outside the enclosure for connection to an electrical circuit controlled by the switching element; and electrically conductive leads interconnecting the switching element and the terminals.

12. The switching device of claim 11 wherein the heatsink has a third group of air ducts on the first side of the base on the opposite side of the circuit board from the first group of ducts and in axial alignment with additional vent openings in the upper and lower walls of the enclosure.

13. The switching device of claim 11 including spacers projecting laterally from one side of the enclosure for maintaining space for air flow between the enclosures of a plurality of the switching devices mounted side-by-side.

14. A solid state switching device, comprising an enclosure having a pair of laterally spaced side walls of substantially greater dimension than the spacing between upper and lower walls with vertically aligned vent openings, mounting means toward the rear of the enclosure for mounting the enclosure in an upright position with the side walls extending vertically, the mounting means including means for mounting the device in an electrical panel and means for mounting the device on a DIN rail, a heatsink within the enclosure having a generally planar mounting surface and a plurality of air ducts aligned axially with the vent openings in the upper and lower walls, a solid state switching element mounted on a circuit board having a generally planar surface opposite the switching element in thermally conductive contact with the mounting surface of the heatsink, terminals accessible outside the enclosure for connection to an electrical circuit controlled by the switching element, and leads interconnecting the switching element and the terminals.

15. A solid state switching device, comprising a heatsink having a generally planar baseplate, a circuit board having a generally planar rear surface in direct thermal contact with the baseplate throughout the entire lateral extent of the rear surface, a solid state switching element mounted on the front side of the circuit board facing away from the baseplate in heat conductive relationship with the heatsink through the circuit board, and an enclosure having first and second generally planar side walls which permit a plurality of the solid state switching devices to be mounted side-by-side with the first side wall of one device facing the second side wall of another, ventilation openings in one of the side walls adjacent to the heatsink through which air can flow to remove heat from the heatsink, and spacers that project laterally from one of the side walls to maintain space for air from the ventilation openings to flow between the side walls of adjacent ones of the devices.

* * * * *